(12) United States Patent
Kim et al.

(10) Patent No.: US 10,950,470 B2
(45) Date of Patent: Mar. 16, 2021

(54) SUBSTRATE BONDING APPARATUS AND BONDING METHOD USING THE SAME

(71) Applicant: SAMSUNG ELECTRONICS CO., LTD., Suwon-si (KR)

(72) Inventors: Taeyeong Kim, Yongin-si (KR); Minsoo Han, Hwaseong-si (KR); Jun Hyung Kim, Yongin-si (KR); Hoonjoo Na, Seoul (KR); Kwangjin Moon, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/397,552

(22) Filed: Apr. 29, 2019

(65) Prior Publication Data
US 2020/0098599 A1  Mar. 26, 2020

(30) Foreign Application Priority Data

Sep. 20, 2018 (KR) .......................... 10-2018-0113155

(51) Int. Cl.
  *H01L 21/67* (2006.01)
  *H01L 21/687* (2006.01)
  *H01L 21/683* (2006.01)
(52) U.S. Cl.
  CPC .... *H01L 21/67092* (2013.01); *H01L 21/6838* (2013.01); *H01L 21/68735* (2013.01)

(58) Field of Classification Search
  None
  See application file for complete search history.

(56) References Cited

U.S. PATENT DOCUMENTS

| 6,386,962 | B1* | 5/2002 | Gotkis ................... B24B 37/30 451/289 |
| 8,389,379 | B2 | 3/2013 | Fournel et al. |
| 8,475,612 | B2 | 7/2013 | Gaudin |
| 9,490,158 | B2 | 11/2016 | Huang et al. |
| 9,539,800 | B2 | 1/2017 | Kito et al. |
| 9,627,243 | B2 | 4/2017 | Liu et al. |
| 9,818,614 | B2 | 11/2017 | Gaudin |
| 9,837,291 | B2 | 12/2017 | Huang et al. |
| 2016/0225655 | A1 | 8/2016 | Matsui et al. |
| 2017/0140955 | A1 | 5/2017 | Liu et al. |
| 2017/0178931 | A1* | 6/2017 | Choi ................. H01L 21/67092 |

FOREIGN PATENT DOCUMENTS

KR  1020160055921  5/2016

* cited by examiner

*Primary Examiner* — Jay C Chang
(74) *Attorney, Agent, or Firm* — F. Chau & Associates, LLC

(57) ABSTRACT

A substrate bonding apparatus includes a lower chuck that receives a lower substrate and an upper chuck disposed above the lower chuck. An upper substrate is fixed to the upper chuck. The upper chuck and the lower chuck bond the upper substrate to the lower substrate. The upper chuck has an upper convex surface toward the lower chuck. The upper convex surface includes a plurality of first ridges and a plurality of first valleys disposed alternately along an azimuthal direction.

12 Claims, 8 Drawing Sheets

SUBSTRATE BONDING APPARATUS AND BONDING METHOD USING THE SAME

CROSS-REFERENCE TO RELATED APPLICATIONS

This application claims priority under 35 U.S.C. § 119 to Korean Patent Application No. 10-2018-0113155 filed on Sep. 20, 2018 in the Korean Intellectual Property Office, the disclosure of which is incorporated by reference in its entirety.

TECHNICAL FIELD

Exemplary embodiments of the present inventive concept relate to an apparatus for fabricating a semiconductor device and a method of manufacturing a semiconductor device, and more particularly, to a substrate bonding apparatus and a substrate bonding method using the same.

DISCUSSION OF THE RELATED ART

With the recent development of semiconductor devices, a stack type semiconductor device and a stack type sensor are suggested as alternatives to effectively reduce the physical size of electronic devices. In a stack type semiconductor device and sensor, a logic cell, a memory cell, a process circuit, and a complementary metal-oxide semiconductor (CMOS) image sensor may be individually fabricated on a plurality of substrates. The plurality of substrates may be bonded to one another to reduce the form factor of the stack type semiconductor device and sensor.

SUMMARY

Exemplary embodiments of the present inventive concept provide a substrate bonding apparatus and a substrate bonding method using the same, in which distortion defects occurring on the substrate are prevented or reduced.

According to an exemplary embodiment of the present inventive concept, a substrate bonding apparatus includes a lower chuck that receives a lower substrate and an upper chuck disposed above the lower chuck. An upper substrate is fixed to the upper chuck. The upper chuck and the lower chuck bond the upper substrate to the lower substrate. The upper chuck has an upper convex surface toward the lower chuck. The upper convex surface includes a plurality of first ridges and a plurality of first valleys disposed alternately along an azimuthal direction.

According to an exemplary embodiment of the present inventive concept a substrate bonding apparatus includes a lower chuck that loads a lower substrate, and an upper chuck disposed above the lower chuck. An upper substrate is fixed to the upper chuck. The upper chuck and the lower chuck bond the upper substrate to the lower substrate. The upper chuck has an upper convex surface toward the lower chuck, and the upper convex surface is non-flat along an azimuthal direction.

According to an exemplary embodiment of the present inventive concept, a substrate bonding method includes fixing an upper substrate on an upper chuck, and bonding the upper substrate to a lower substrate. The lower substrate is disposed on a lower chuck that faces the upper chuck. Bonding the upper substrate to the lower substrate includes bonding a center of the upper substrate to a center of the lower substrate and bonding an edge of the upper substrate to an edge of the lower substrate. Bonding the edge of the upper substrate to the lower substrate includes bonding a plurality of first ridge portions of the upper substrate to a plurality of second ridge portions of the lower substrate, and bonding a plurality of first valley portions disposed between the first ridge portions to a plurality of second valley portions disposed between the second ridge portions.

BRIEF DESCRIPTION OF THE DRAWINGS

The above and other features of the present inventive concept will become more apparent by describing in detail exemplary embodiments thereof with reference to the accompanying drawings, in which.

DETAILED DESCRIPTION OF THE EXEMPLARY EMBODIMENTS

Figure 1:
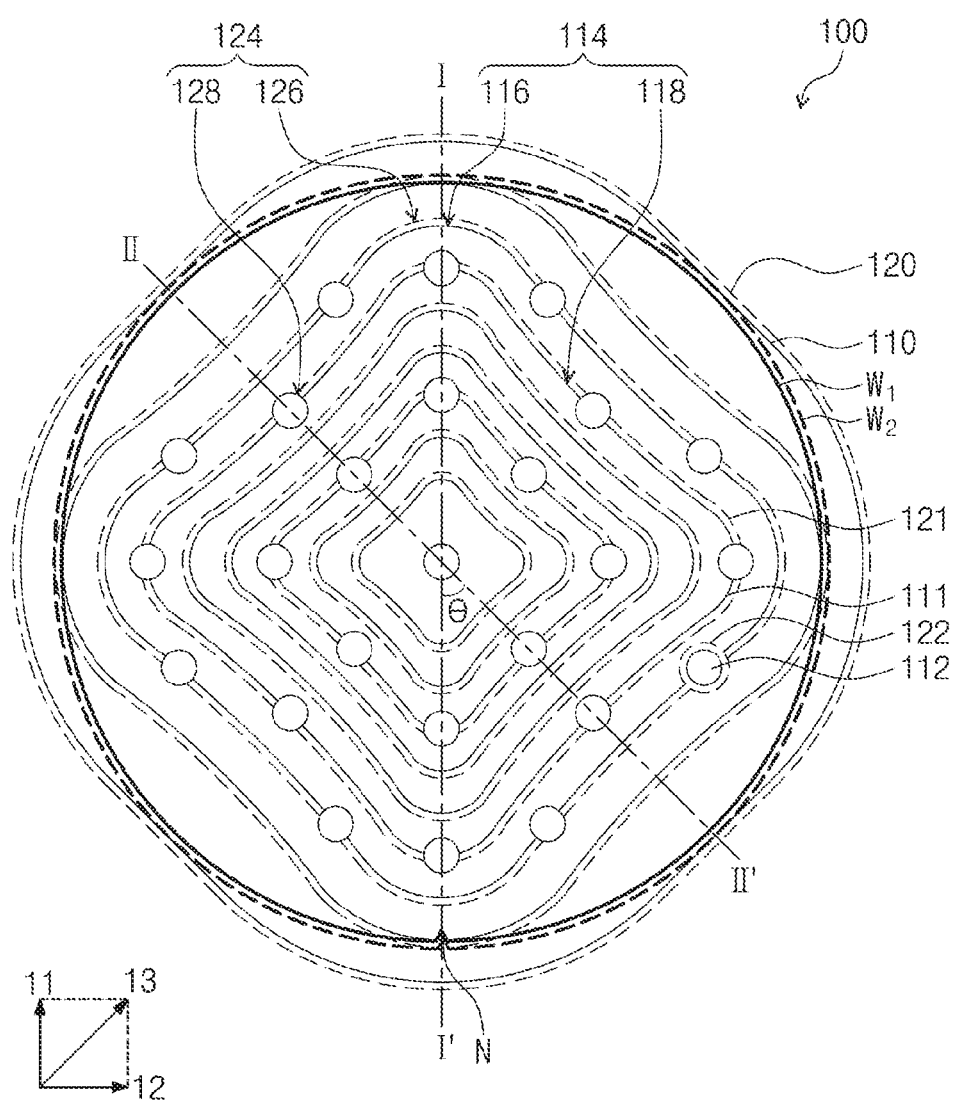
FIG. 1 illustrates a plan view showing a substrate bonding apparatus according to exemplary embodiments of the present inventive concept.

Exemplary embodiments of the present inventive concept will be described more fully hereinafter with reference to the accompanying drawings. Like reference numerals may refer to like elements throughout the accompanying drawings.

Spatially relative terms, such as "beneath," "below," "lower," "above," "upper," etc. may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

It will be understood that the terms "first," "second," "third," etc. are used herein to distinguish one element from another, and the elements are not limited by these terms. Thus, a "first" element in an exemplary embodiment may be described as a "second" element in another exemplary embodiment.

The term "about" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations as understood by one of the ordinary skill in the art. Further, it is to be understood that while parameters may be described herein as having "about" a certain value, according to exemplary embodiments, the parameter may be exactly the certain value or approximately the certain value within a measurement error as would be understood by a person having ordinary skill in the art.

Herein, when two or more elements or values are described as being substantially the same as each other, it is to be understood that the elements or values are identical to each other, indistinguishable from each other, or distinguishable from each other but functionally the same as each other as would be understood by a person having ordinary skill in the art. It will be further understood that when two components or directions are described as extending substantially parallel or perpendicular to each other, the two components or directions extend exactly parallel or perpendicular to each other, or extend approximately parallel or perpendicular to each other within a measurement error as would be understood by a person having ordinary skill in the art.

Figure 2:
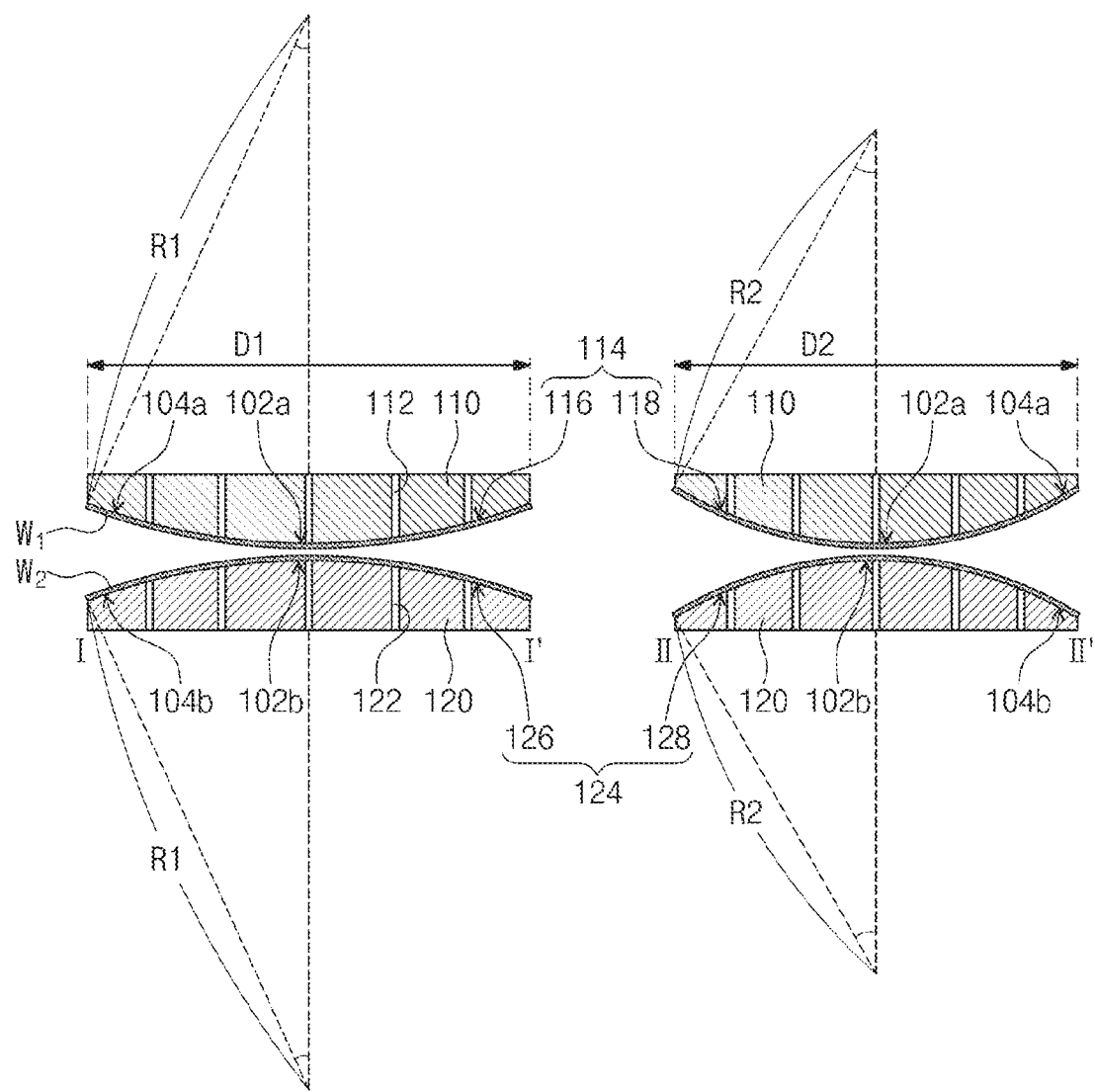
FIG. 2 illustrates cross-sectional views taken along lines I-I' and II-II' of FIG. 1.

FIG. 1 is a plan view illustrating a substrate bonding apparatus 100 according to exemplary embodiments of the present inventive concept. FIG. 2 illustrates cross-sectional views taken along lines I-I' and II-II' of FIG. 1.

Referring to FIGS. 1 and 2, the substrate bonding apparatus 100 may be a wafer bonding apparatus. In an exemplary embodiment, the substrate bonding apparatus 100 may include an upper chuck 110 and a lower chuck 120. The upper chuck 110 and the lower chuck 120 may be configured such that an upper substrate W1 and a lower substrate W2 are respectively fixed thereon and are bonded to each other therebetween. For example, as shown in FIG. 2, the upper substrate W1 may be fixed on the upper chuck 110 and the lower substrate W2 may be fixed on the lower chuck 120, and the upper substrate W1 may be bonded to the lower substrate W2, as described below.

The upper chuck 110 may be disposed on the lower chuck 120. The upper chuck 110 may include, for example, a resilient material such as rubber or polydimethylsiloxane (PDMS). However, the upper chuck 110 is not limited thereto. The upper chuck 110 may have first adsorption holes 112 and an upper convex surface 114.

The first adsorption holes 112 may be provided therein with a vacuum pressure. The vacuum pressure may allow the upper convex surface 114 to closely adhere to and/or adsorb the upper substrate W1. The upper substrate W1 may be, for example, a silicon wafer having a (100) crystal plane. The upper substrate W1 may have a circular shape. The upper substrate W1 may have application processor (AP) devices, memory devices, logic devices, and/or connection lines formed thereon. Alternatively, the upper substrate W1 may be a gallium arsenide wafer or a gallium nitride wafer. However, the upper substrate W1 is not limited thereto.

The upper convex surface 114 may protrude from the upper chuck 110. For example, the upper convex surface 114 may be convex in a direction away from the upper chuck 110 and toward the lower chuck 120. Herein, when the upper chuck 110 is described as having the upper convex surface 114 toward the lower chuck 120, it is to be understood that the upper convex surface 114 is convex toward the lower chuck 120. The vacuum pressure provided by the first adsorption holes 112 may force the upper substrate W1 to bend along the upper convex surface 114 and toward the lower chuck 120, as shown in FIG. 2. In an exemplary embodiment, the upper convex surface 114 may have a height represented by first contour lines 111. The first contour lines 111 may have anisotropic shapes. For example, the first contour lines 111 may be shaped like square circles or squircles. For example. The first contour lines 111 may be shaped like squares having rounded corners. The first contour lines 111 may be shown in such a way that square circles rotate along an azimuthal direction $\theta$ of about $\pi/4$ radian (e.g., about 45°) relative to a notch N of the upper substrate W1. The upper substrate W1 may be deformed along the upper convex surface 114 from a center 102a to an edge 104a of the upper substrate W1. The deformed upper substrate W1 may have a circular shape when viewed in a plan view. For example, the upper convex surface 114 of the upper chuck 110 may bend the upper substrate W1 into a convex shape without changing the circular shape of the upper substrate W1. In addition, the upper chuck 110 may bond the upper substrate W1 to the lower substrate W2 without changing the circular shape of the upper substrate W1 and/or distorting the upper substrate W1.

Figure 3:
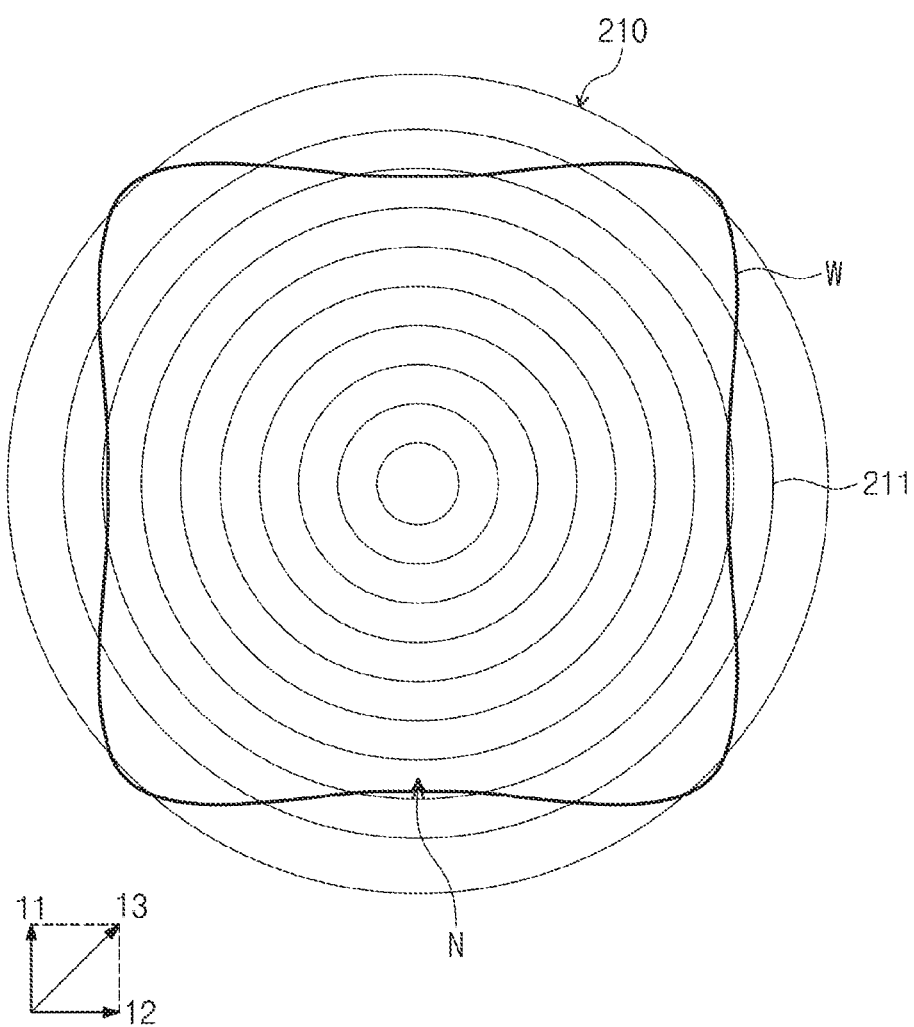
FIG. 3 illustrates a plan view showing a chuck according to a comparative example.

FIG. 3 illustrates a plan view showing a chuck 210 according to a comparative example.

Referring to FIG. 3, the chuck 210 may be represented by contour lines 211 shaped like isotropic circles. A substrate W may be a silicon wafer having a circular shape, and may bend along the isotropic contour lines 211 of the chuck 210. The substrate may include a notch N. The substrate W may have a convex shape toward the front of FIG. 3. In FIG. 3, the substrate W is exaggeratedly illustrated to show that the convexly bent substrate W does not have an exactly circular shape when viewed in a plan view. For example, the substrate W may be bent into a square circular shape when viewed in a plan view. For example, the substrate W may be deformed to have a square circular shape, based on the Poisson's ratio in a diagonal direction 13 to a notch direction 11 of the substrate W, or in both the diagonal direction 13 and an orthogonal direction 12 to the notch direction 11. The substrate W having the square circular shape may suffer from distortion during its bonding. The notch direction 11 and the orthogonal direction 12 may respectively correspond to a vertical direction and a horizontal direction on a plane parallel to the substrate W. Alternatively, the substrate W may be deformed to have a square circular shape, based on a difference in Young's modulus between the notch direction 11 and the diagonal direction 13 or between the orthogonal direction 12 and the diagonal direction 13.

Figure 4:
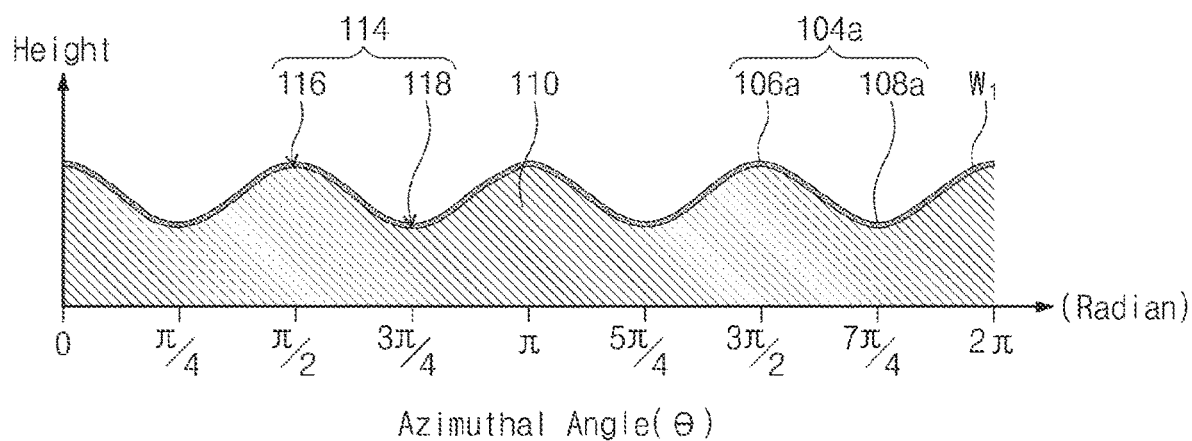
FIG. 4 illustrates a cross-sectional view showing an upper substrate taken along an edge thereof shown in FIGS. 1 and 2.

FIG. 4 illustrates a cross-sectional view showing the upper substrate W1 taken along the edge 104a thereof shown in FIGS. 1 and 2.

Referring to FIGS. 1, 2, and 4, the upper convex surface 114 may be non-flat, uneven or rugged along the azimuthal direction $\theta$ of the upper chuck 110 as a result of, for example, ridges and valleys being formed therein. In an exemplary embodiment, the upper convex surface 114 of the upper chuck 110 may include first ridges 116 and first valleys 118. The first ridges 116 and the first valleys 118 may be disposed alternately along the azimuthal direction $\theta$. For example, the first ridges 116 and the first valleys 118 may be disposed alternately at about every $\pi/4$ radian along the azimuthal direction θ. The first ridges 116 may be disposed at about θ, about π/2, about π, about 3π/2, and about 2π radians, and the first valleys 118 may be disposed at about π/4, about 3π/4, about 5π/4, and about 7π/4 radians.

The first ridges 116 may be higher than the first valleys 118. For example, a thickness of the upper convex surface 114 may be thicker at the first ridges 116 than at the first valleys 118. The first ridges 116 may support the upper substrate W1 in a notch direction 11 (e.g., about π and about 2π radians) and an orthogonal direction 12 (e.g., about π/2 and about 3π/2 radians). For example, the first ridges 116 may support first ridge portions 106a of the upper substrate W1 from the upper substrate's W1 center 102a to its edge 104a. The first ridges 116 may have a first curvature radius R1. For example, when the upper substrate W1 has a diameter of about 30 cm, the first curvature radius R1 may be about 2 m. A pair of facing first ridges 116 may be spaced apart from each other at a first maximum linear distance D1. The first maximum linear distance D1 may be about 29 cm.

The first valleys 118 may be lower than the first ridges 116. The first valleys 118 may support the upper substrate W1 in a diagonal direction 13 (e.g., about π/4, about 3π/4, about 5π/4, and about 7π/4 radians) between the notch direction 11 and the orthogonal direction 12. For example, the first valleys 118 may support first valley portions 108a of the upper substrate W1 from the upper substrate's W1 center 102a to its edge 104a. The first valleys 118 may have a second curvature radius R2. The second curvature radius R2 may be less than the first curvature radius R1. In such cases, the first valleys 118 may have a curvature greater than that of the first ridges 116. The curvature of the first ridges 116 may be the reciprocal (1/R1) of the first curvature radius R1, and the curvature of the first valleys 118 may be the reciprocal (1/R2) of the second curvature radius R2. For example, when the upper substrate W1 has a diameter of about 30 cm, the second curvature radius R2 may be about 1.8 m. Thus, in an exemplary embodiment, the first ridges 116 have the first curvature radius R1, the first valleys 118 have the second curvature radius R2, the first curvature radius R1 is greater than the second curvature radius R2, the first ridges 116 have a first curvature, the first valleys 118 have a second curvature, and the first curvature is less than the second curvature. A pair of facing first valleys 118 may be spaced apart from each other at a second maximum linear distance D2 less than the first maximum linear distance D1. For example, the second maximum linear distance D2 may be about 28 cm between the pair of facing first valleys 118.

Referring back to FIGS. 1 and 2, the lower chuck 120 may be disposed beneath the upper chuck 110. The lower chuck 120 may include the same material as that of the upper chuck 110. For example, the lower chuck 120 may include a resilient material such as rubber or polydimethylsiloxane (PDMS). The lower chuck 120 may have a convex shape away from the lower chuck 120 and toward the upper chuck 110. However, the lower chuck 120 is not limited thereto. For example, in exemplary embodiments, the lower chuck 120 may be substantially flat. The lower chuck 120 may have second adsorption holes 122 and a lower convex surface 124.

The second adsorption holes 122 may be provided therein with a vacuum pressure. The vacuum pressure may allow the lower convex surface 124 to closely adhere to and/or adsorb the lower substrate W2. The lower substrate W2 may be, for example, a silicon wafer having a circular shape. The lower substrate W2 may have devices the same as or different from those formed on the upper substrate W1. For example, the lower substrate W2 may have application processor (AP) devices, memory devices, logic devices, and/or connection lines disposed thereon.

The lower convex surface 124 may protrude in a direction away from the lower chuck 120 and toward the upper chuck 110. For example, the lower convex surface 124 may be convex toward the upper chuck 110. Herein, when the lower chuck 120 is described as having the lower convex surface 124 toward the upper chuck 110, it is to be understood that the lower convex surface 124 ix convex toward the upper chuck 110. The lower convex surface 124 may have a height represented by second contour lines 121. The second contour lines 121 may overlap the first contour lines 111. The vacuum pressure provided by the second adsorption holes 122 may force the lower substrate W2 to bend along the second contour lines 121 of the lower convex surface 124. The lower substrate W2 may have a circular shape when viewed in a plan view. The lower convex surface 124 may bend the lower substrate W2 into a convex shape without changing the circular shape of the lower substrate W2.

Figure 5:
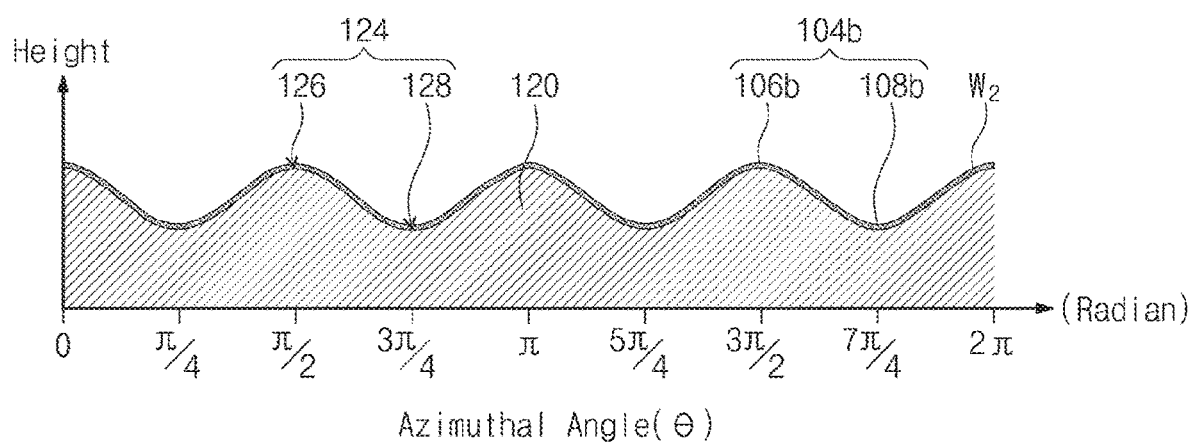
FIG. 5 illustrates a cross-sectional view showing a lower substrate taken along an edge thereof shown in FIGS. 1 and 2.

FIG. 5 illustrates a cross-sectional view showing the lower substrate W2 taken along an edge thereof shown in FIGS. 1 and 2.

Referring to FIGS. 1, 2, and 5, the lower convex surface 124 may be non-flat, uneven or rugged along an azimuthal direction θ of the lower chuck 120. In an exemplary embodiment, the lower convex surface 124 of the lower chuck 120 may include second ridges 126 and second valleys 128. The second ridges 126 and the second valleys 128 may be disposed alternately along the azimuthal direction θ. For example, the second ridges 126 and the second valleys 128 may be disposed alternately at about every π/4 radian along the azimuthal direction θ. The second ridges 126 may be disposed at about 0, about π/2, about π, about 3π/2, and about 2π radians, and the second valleys 128 may be disposed at about π/4, about 3π/4, about 5π/4, and about 7π/4 radians.

The second ridges 126 may be higher than the second valleys 128. For example, a thickness of the lower convex surface 124 may be thicker at the second ridges 126 than at the second valleys 128. The second ridges 126 may support the lower substrate W2 in the notch direction 11 or the orthogonal direction 12. The second ridges 126 may support second ridge portions 106b of the lower substrate W2 from the lower substrate's W2 center 102b to its edge 104b. In an exemplary embodiment, the second ridges 126 may have a curvature radius that is about the same as the first curvature radius R1 of the first ridges 116. For example, the second ridges 126 may have the first curvature radius R1. A pair of facing second ridges 126 may be spaced apart from each other at the first maximum linear distance D1. The first maximum linear distance D1 may be about 29 cm.

The second valleys 128 may be lower than the second ridges 126. The second valleys 128 may support the lower substrate W2 in the diagonal direction 13. The second valleys 128 may support second valley portions 108b of the lower substrate W2 from the lower substrate's W2 center 102b to its edge 104b. In an exemplary embodiment, the second valleys 128 may have the second curvature radius R2 that is less than the first curvature radius R1. For example, when the lower substrate W2 has a diameter of about 30 cm, the second curvature radius R2 may be about 1.5 m. A pair of facing second valleys 128 may be spaced apart from each other at the second maximum linear distance D2. The second maximum linear distance D2 may be about 28 cm.

Figure 6:
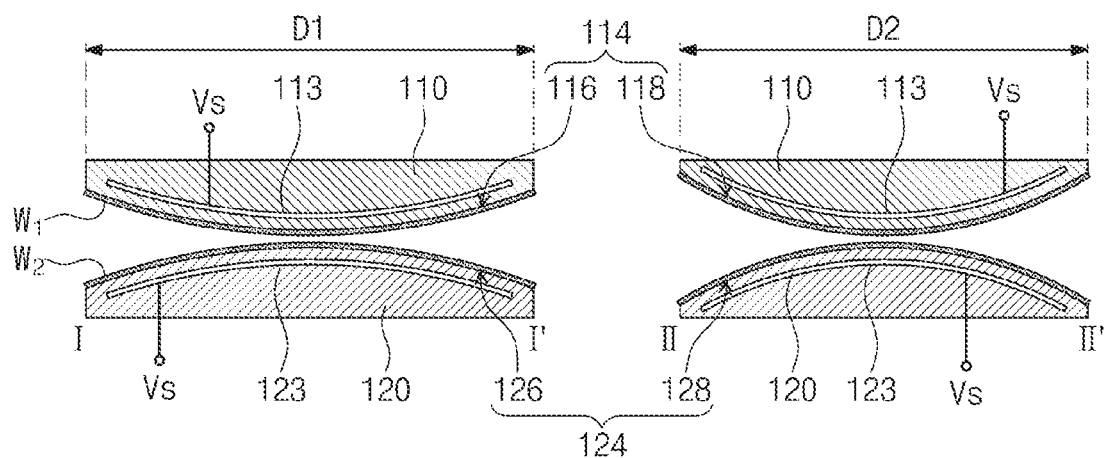
FIG. 6 illustrates cross-sectional views showing examples of upper and lower chucks taken along lines I-I' and II-II' of FIG. 1, respectively.

FIG. 6 illustrates cross-sectional views showing examples of the upper and lower chucks 110 and 120 taken along lines I-I' and II-II' of FIG. 1, respectively.

Referring to FIG. 6, the upper chuck 110 may include an upper electrode 113, and the lower chuck 120 may include a lower electrode 123. When an electrostatic voltage Vs is applied to the upper electrode 113 and the lower electrode 123, the electrostatic voltage Vs may cause the upper substrate W1 and the lower substrate W2 to be respectively fixed on the upper convex surface 114 and the lower convex surface 124. The upper and lower convex surfaces 114 and 124 may be configured identically to the upper and lower convex surfaces 114 and 124 shown in FIG. 2. Thus, for convenience of explanation, a further description thereof is omitted.

A substrate bonding method using the substrate bonding apparatus 100 described above will now be described.

Figure 7:
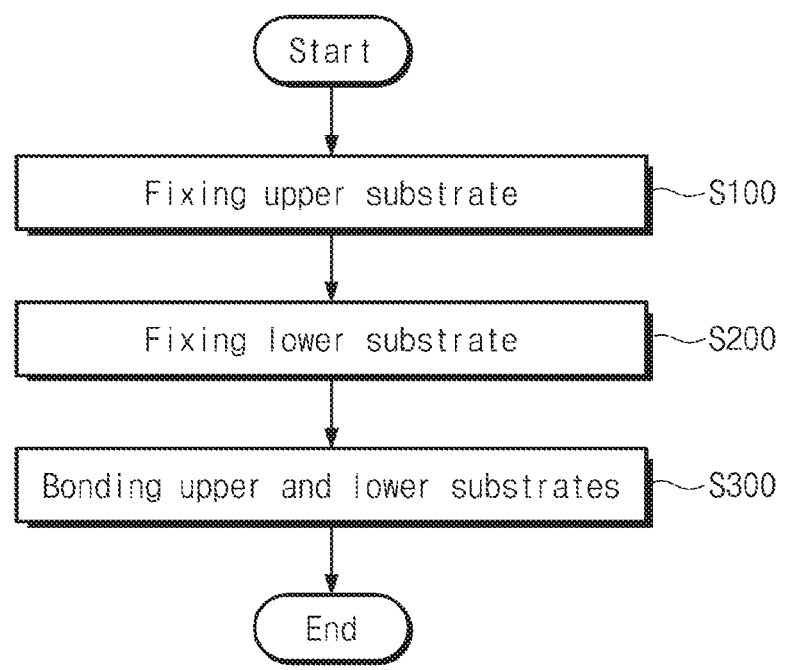
FIG. 7 illustrates a flowchart showing a substrate bonding method according to exemplary embodiments of the present inventive concept.

FIG. 7 illustrates a flowchart showing a substrate bonding method according to exemplary embodiments of the present inventive concept.

Referring to FIG. 7, the substrate bonding method may include fixing the upper substrate W1 (S100), fixing the lower substrate W2 (S200), and bonding the upper and lower substrates W1 and W2 to each other (S300). This process is described in further detail below.

Referring to FIGS. 1, 2, 4, and 7, the upper substrate W1 may be fixed on the upper chuck 110 (S100). This may be implemented by, for example, a robot arm placing the upper substrate W1 on a location below the upper chuck 110, and the vacuum pressure of the first adsorption holes 112 or the electrostatic voltage Vs of the upper chuck 110 fixing the upper substrate W1 on the upper convex surface 114. The vacuum pressure of the first adsorption holes 112 may be sequentially provided from the center 102a to the edge 104a of the upper substrate W1. For example, the vacuum pressure may first be provided by the first adsorption holes 112 at the center 102a of the upper substrate W1, and then may be sequentially provided by the first adsorption holes 112 extending in a direction away from the center 102a of the upper substrate W1 to the edge 104a of the upper substrate W1, until the first adsorption holes 112 at the edge 104a finally provide the vacuum pressure. Thus, the upper substrate W1 may gradually bend from the center 102a to the edge 104a of the upper substrate W1. The upper substrate W1 may bend along the upper convex surface 114. When the upper substrate W1 is fixed on the upper convex surface 114, the upper substrate W1 may be bent while maintaining its circular shape when viewed in a plan view. The edge 104a of the upper substrate W1 may be bent to have different heights along the azimuthal direction θ. The edge 104a of the upper substrate W1 may have the first ridge portions 106a and the first valley portions 108a. The first ridge portions 106a may bend less than the first valley portions 108a. The first valley portions 108a may have a curvature greater than that of the first ridge portions 106a. The first ridge portions 106a and the first valley portions 108a may be formed alternately at about every π/4 radian along the azimuthal direction θ. The first ridge portions 106a may be formed along the notch direction 11 (e.g., about 0, about π, and about 2π radians) and the orthogonal direction 12 (e.g., about π/2 and about 2π radians).

The lower substrate W2 may be fixed on the lower chuck 120 (S200). This may be implemented by, for example, a robot arm placing the lower substrate W2 on the lower chuck 120, and the vacuum pressure of the second adsorption holes 122 or the electrostatic voltage Vs of the lower chuck 120 fixing the lower substrate W2 on the lower convex surface 124. Alternatively, when the lower chuck 120 is flat, the lower substrate W2 may be loaded on the lower chuck 120. The vacuum pressure of the second adsorption holes 122 may be sequentially provided from the center 102b to the edge 104b of the lower substrate W2. For example, the vacuum pressure may first be provided by the second adsorption holes 122 at the center 102b of the lower substrate W2, and then may be sequentially provided by the second adsorption holes 122 extending in a direction away from the center 102b of the lower substrate W2 to the edge 104b of the lower substrate W2, until the second adsorption holes 122 at the edge 104b finally provide the vacuum pressure. The lower substrate W2 may gradually bend from the center 102b to the edge 104b of the lower substrate W2.

The lower substrate W2 may bend along the lower convex surface 124. When the lower substrate W2 is fixed on the lower convex surface 124, the lower substrate W2 may be bent while maintaining its circular shape when viewed in a plan view. The edge 104b of the lower substrate W2 may be bent to have different heights along the azimuthal direction θ. The edge 104b of the lower substrate W2 may have the second ridge portions 106b and the second valley portions 108b. The second ridge portions 106b may bend less than the second valley portions 108b. The second valley portions 108b may have a curvature greater than that of the second ridge portions 106b. For example, the second ridge portions 106b and the second valley portions 108b may be formed alternately at about every π/4 radian along the azimuthal direction θ. The second ridge portions 106b may be formed along the notch direction 11 (e.g., about 0, about π, and about 2π radians) and the orthogonal direction 12 (e.g., about π/2 and about 2π radians).

The upper substrate W1 and the lower substrate W2 may be bonded to each other (S300). This may be implemented by, for example, the upper chuck 110 descending toward the lower chuck 120. When the upper chuck 110 and the lower chuck 120 become close to each other, the upper substrate W1 and the lower substrate W2 may be bonded to each other. Each of the upper and lower substrates W1 and W2 may have an adhesive dielectric layer that is used during the bonding process.

Figure 8:
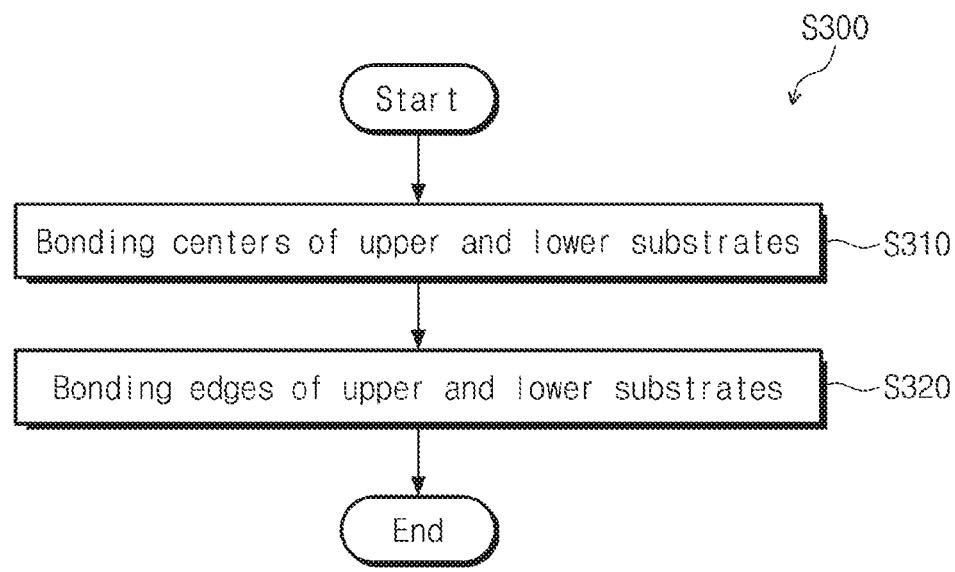
FIG. 8 illustrates a flowchart showing an example of a substrate bonding operation in the flowchart of FIG. 7.

FIG. 8 illustrates a flowchart showing an example of the substrate bonding operation S300 in the flowchart of FIG. 7.

Referring to FIG. 8, the operation S300 of bonding the upper and lower substrates W1 and W2 may include bonding the centers 102a and 102b of the upper and lower substrates W1 and W2 (S310), and bonding the edges 104a and 104b of the upper and lower substrates W1 and W2 (S320). For example, in an exemplary embodiment, the centers 102a and 102b of the upper and lower substrates W1 and W may first be bonded to each other in operation S310, and the edges 104a and 104b of the upper and lower substrates W1 and W2 may then be subsequently bonded to each other after the centers 102a and 102b are bonded to each other.

Figure 9:
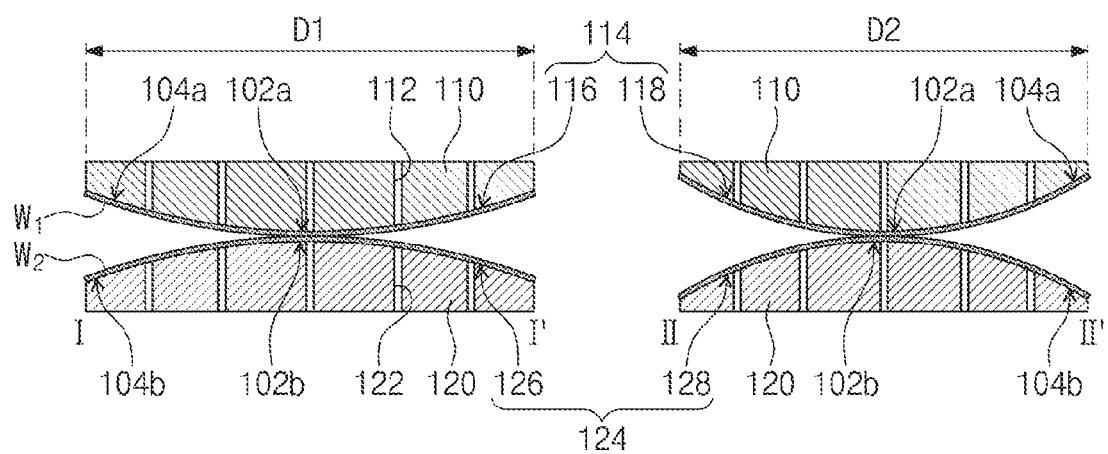
FIGS. 9 and 10 illustrate cross-sectional views showing a process of bonding upper and lower substrates shown in FIG. 2.
Figure 10:
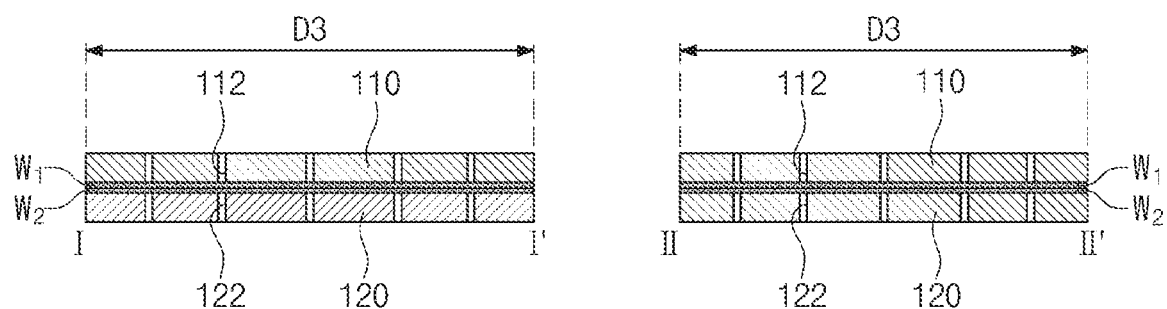

FIGS. 9 and 10 illustrate cross-sectional views showing a process of bonding the upper and lower substrates W1 and W2 shown in FIG. 2.

Referring to FIGS. 8 and 9, the upper chuck 110 and the lower chuck 120 may bond the center 102a of the upper substrate W1 to the center 102b of the lower substrate W2 (S310). The upper chuck 110 may move toward the lower chuck 120. For example, the upper substrate W1 may be adhered to the upper chuck 110, the lower substrate W2 may be adhered to the lower chuck 120, and the upper chuck 110 may be moved toward the lower chuck 120. When the centers 102a and 102b of the upper and lower substrates W1 and W2 are bonded to each other, the vacuum pressure may be removed from the first and second adsorption holes 112 and 122 corresponding to the centers 102a and 102b of the upper and lower substrates W1 and W2, or the electrostatic voltage Vs may be removed from the upper and lower electrodes 113 and 123.

Referring to FIGS. 8 and 10, the upper chuck 110 and the lower chuck 120 may bond the edge 104a of the upper substrate W1 to the edge 104b of the lower substrate W2 (S320). The edges 104a and 104b of the upper substrate W1 and the lower substrate W2 may be bonded to each other after the center 102a of the upper substrate W1 and the center 102b of the lower substrate W2 have been bonded to each other. When the upper chuck 110 and the lower chuck 120 are closely coupled to each other, the upper substrate W1 and the lower substrate W2 may be gradually bonded from their centers 102a and 102b to their edges 104a and 104b. The upper convex surface 114 and the lower convex surface 124 may become substantially flat due to extension in their diameter directions and/or their outward directions. For example, as the upper substrate W1 and the lower substrate W2 are gradually bonded from their centers 102a and 102b to their edges 104a and 104b, the upper convex surface 114 and the lower convex surface 124 may become substantially flat. The upper chuck 110 and the lower chuck 120 may each have a diameter D3 greater than the first and second maximum linear distances D1 and D2. The diameter D3 of each of the upper and lower chucks 110 and 120 may be substantially the same as that of each of the upper and lower substrates W1 and W2.

Figure 11:
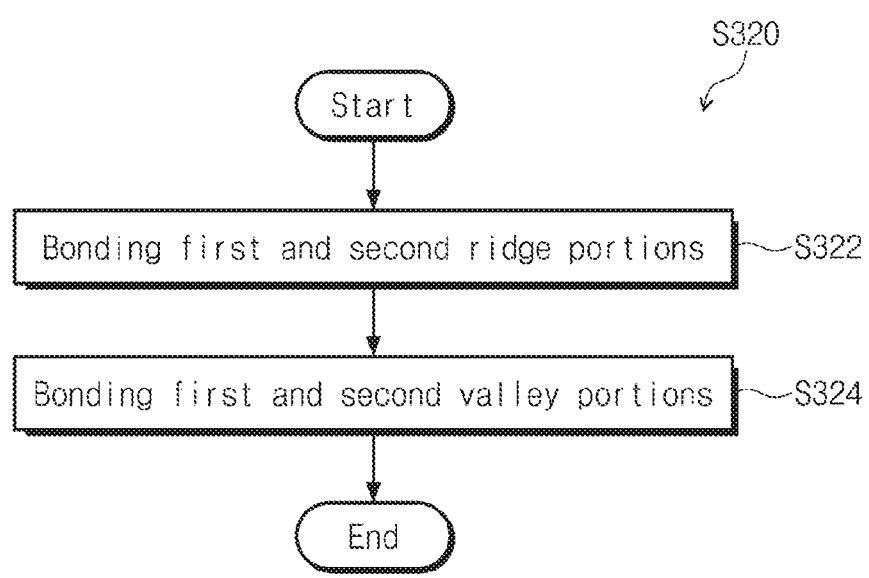
FIG. 11 illustrates a flowchart showing an example of a substrate edge bonding operation in the flowchart of FIG. 8.

FIG. 11 illustrates a flowchart showing an example of the edge bonding operation S320 in the flowchart of FIG. 8.

Referring to FIG. 11, the operation S320 of bonding the edges 104a and 104b of the upper and lower substrates W1 and W2 may include bonding the first and second ridge portions 106a and 106b to each other (S322) and bonding the first and second valley portions 108a and 108b to each other (S324).

Figure 12:
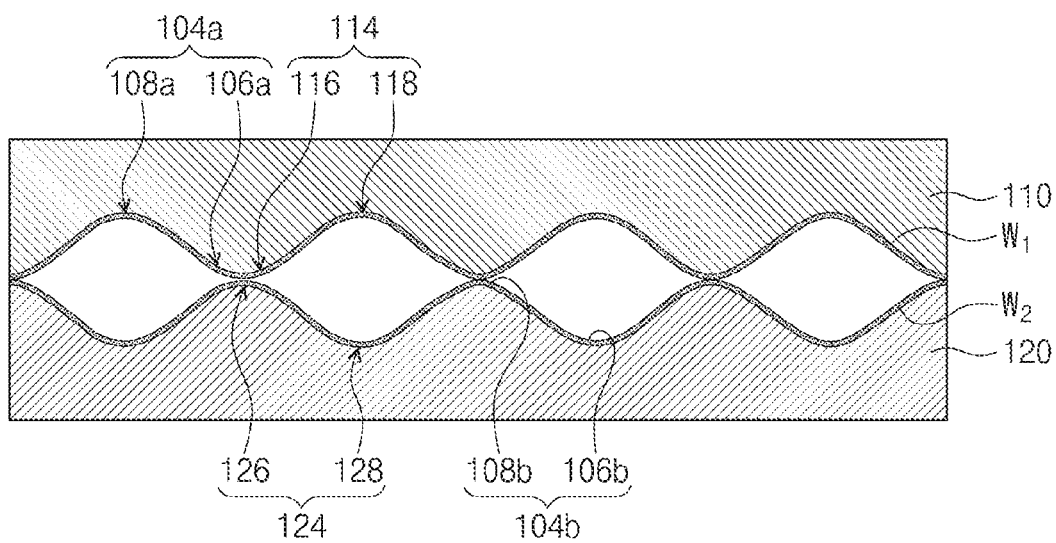
FIGS. 12 and 13 illustrate cross-sectional views showing a process of bonding edges of the upper and lower substrates shown in FIGS. 4 and 5.
Figure 13:
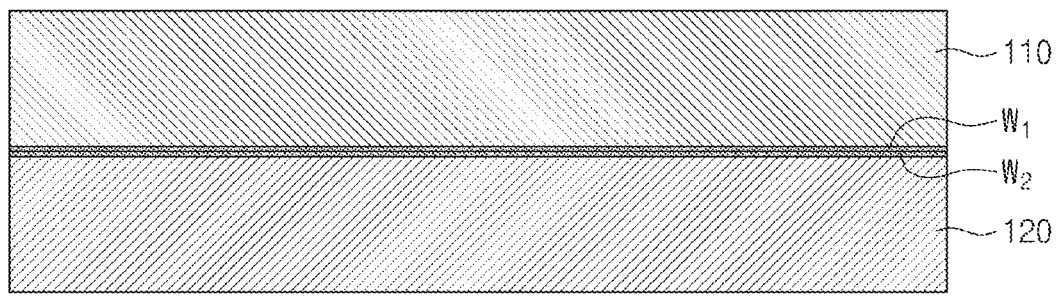

FIGS. 12 and 13 illustrate cross-sectional views showing a process of bonding the edges 104a and 104b of the upper and lower substrates W1 and W2 shown in FIGS. 4 and 5.

Referring to FIGS. 11 and 12, the first and second ridges 116 and 126 of the upper and lower chucks 110 and 120 may bond the first and second ridge portions 106a and 106b of the upper and lower substrates W1 and W2 (S322). For example, in an exemplary embodiment, as the upper chuck 110 moves toward the lower chuck 120, the first ridges 116 of the upper chuck 110 may be moved toward the second ridges 126 of the lower chuck 120, causing the first ridge portions 106a of the upper substrate W1 to make contact with the second ridge portions 106b of the lower substrate W2.

As shown in FIG. 12, in an exemplary embodiment, the second valleys 128 may be aligned with and disposed on the first valleys 118, the second ridges 126 may be aligned with and disposed on the first ridges 116.

Referring to FIGS. 11 and 13, the first and second valleys 118 and 128 of the upper and lower chucks 110 and 120 may bond the first and second valley portions 108a and 108b of the upper and lower substrates W1 and W2 (S324). For example, in an exemplary embodiment, as the upper chuck 110 moves toward the lower chuck 120, the first valleys 118 of the upper chuck 110 may move toward the second valleys 128 of the lower chuck 120, causing the first valley portions 108a of the upper substrate W1 to make contact with the second valley portions 108b of the lower substrate W2. The bonded upper and lower substrates W1 and W2 may have their circular shapes when viewed in a plan view, and may be substantially flat without their distortions along the azimuthal direction θ.

Alternatively, in an exemplary embodiment, when the center 102a of the upper substrate W1 is bonded to the center 102b of the lower substrate W2, the upper chuck 110 may stop its descending movement. When the upper chuck 110 stops its descending movement, the vacuum pressure of the first and second adsorption holes 112 and 122 may be removed gradually from the centers 102a and 102b to the edges 104a and 104b. When the vacuum pressure of the first and second adsorption holes 112 and 122 is gradually removed in this manner, the upper substrate W1 and the lower substrate W2 may be bonded from their centers 102a and 102b to their edges 104a and 104b. Thus, the upper and lower substrates W1 and W2 may be bonded substantially flat without distortion along the azimuthal direction θ. In addition, the occurrence of air bubbles may be avoided between the upper substrate W1 and the lower substrate W2.

According to exemplary embodiments of the present inventive concept, a substrate bonding apparatus may be configured to bend a substrate, without changing its circular shape, into a convex shape corresponding to that of a chuck including ridges and valleys along an azimuthal direction of the chuck. As a result, the substrate may be prevented from being distorted during a bonding process.

While the present inventive concept has been particularly shown and described with reference to the exemplary embodiments thereof, it will be understood by those of ordinary skill in the art that various changes in form and detail may be made therein without departing from the spirit and scope of the present inventive concept as defined by the following claims.

What is claimed is:

1. A substrate bonding apparatus, comprising:
a lower chuck that receives a lower substrate; and
an upper chuck disposed above the lower chuck,
wherein an upper substrate is fixed to the upper chuck, and the upper chuck and the lower chuck bond the upper substrate to the lower substrate,
wherein the upper chuck has an upper convex surface toward the lower chuck,
wherein the upper convex surface comprises a plurality of first ridges and a plurality of first valleys disposed alternately along an azimuthal direction,
wherein the first ridges and the first valleys are disposed alternately at about every $\pi/4$ radian along the azimuthal direction.

2. The substrate bonding apparatus of claim 1, wherein
the first ridges are disposed at about $\pi/2$, about $\pi$, about $3\pi/2$, and about $2\pi$ radians along the azimuthal direction, and
the first valleys are disposed at about $\pi/4$, about $3\pi/4$, about $5\pi/4$, and about $7\pi/4$ radians along the azimuthal direction.

3. The substrate bonding apparatus of claim 1, wherein
the upper chuck comprises a plurality of first adsorption holes that vacuum-adsorb the upper substrate to the upper chuck, and
the lower chuck comprises a plurality of second adsorption holes that vacuum-adsorb the lower substrate to the lower chuck.

4. The substrate bonding apparatus of claim 1, wherein
the upper chuck comprises an upper electrode that electrostatically fixes the upper substrate to the upper chuck, and the lower chuck comprises a lower electrode that electrostatically fixes the lower substrate to the lower chuck.

5. A substrate bonding apparatus, comprising:
a lower chuck that receives a lower substrate; and
an upper chuck disposed above the lower chuck,
wherein an upper substrate is fixed to the upper chuck, and the upper chuck and the lower chuck bond the upper substrate to the lower substrate,
wherein the upper chuck has an upper convex surface toward the lower chuck,
wherein the upper convex surface comprises a plurality of first ridges and a plurality of first valleys disposed alternately along an azimuthal direction,
wherein the first ridges have a first curvature radius, the first valleys have a second curvature radius, and the first curvature radius is greater than the second curvature radius.

6. The substrate bonding apparatus of claim 5, wherein the first ridges have a first curvature, the first valleys have a second curvature, and the first curvature is less than the second curvature.

7. The substrate bonding apparatus of claim 5, wherein the lower chuck has a lower convex surface toward the upper chuck, and
the lower convex surface comprises a plurality of second ridges and a plurality of second valleys disposed alternately along the azimuthal direction.

8. The substrate bonding apparatus of claim 7, wherein the second valleys are disposed on the first valleys, and the second ridges are disposed on the first ridges.

9. The substrate bonding apparatus of claim 7, wherein the second ridges have the first curvature radius, and the second valleys have the second curvature radius.

10. A substrate bonding apparatus, comprising:
a lower chuck that loads a lower substrate; and
an upper chuck disposed above the lower chuck,
wherein an upper substrate is fixed to the upper chuck, and the upper chuck and the lower chuck bond the upper substrate to the lower substrate,
wherein the upper chuck has an upper convex surface toward the lower chuck, and the upper convex surface is non-flat along an azimuthal direction,
wherein the upper convex surface comprises:
a plurality of ridges; and
a plurality of valleys disposed between and below the ridges,
wherein a pair of facing ridges are spaced apart at a first maximum linear distance, and a pair of facing valleys are spaced apart at a second maximum linear distance less than the first maximum linear distance.

11. The substrate bonding apparatus of claim 10, wherein the upper chuck comprises rubber or polydimethylsiloxane (PDMS).

12. A substrate bonding apparatus, comprising:
a lower chuck that loads a lower substrate; and
an upper chuck disposed above the lower chuck,
wherein an upper substrate is fixed to the upper chuck, and the upper chuck and the lower chuck bond the upper substrate to the lower substrate,
wherein the upper chuck has an upper convex surface toward the lower chuck, and the upper convex surface is non-flat along an azimuthal direction,
wherein the lower chuck has a lower convex surface toward the upper chuck, and the lower convex surface is non-flat along the azimuthal direction.

* * * * *